US008490271B2

(12) United States Patent
Harvilchuck et al.

(10) Patent No.: US 8,490,271 B2
(45) Date of Patent: Jul. 23, 2013

(54) FLEXIBLE SUBSTRATE TENSIONER

(75) Inventors: Laurence A. Harvilchuck, Brackney, PA (US); George R. Westby, Owego, NY (US)

(73) Assignee: Universal Instruments Corporation, Binghamton, NY (US)

( * ) Notice: Subject to any disclaimer, the term of this patent is extended or adjusted under 35 U.S.C. 154(b) by 1603 days.

(21) Appl. No.: 11/953,277

(22) Filed: Dec. 10, 2007

(65) Prior Publication Data
US 2009/0146355 A1 Jun. 11, 2009

(51) Int. Cl.
*B23P 11/02* (2006.01)
(52) U.S. Cl.
USPC .............................. 29/448; 361/749
(58) Field of Classification Search
USPC ........... 29/91.5, 448; 361/749; 38/102, 102.1, 38/102.2, 102.3, 102.4, 102.7, 102.8; 160/378; 69/19
See application file for complete search history.

(56) References Cited

U.S. PATENT DOCUMENTS

| | | | |
|---|---|---|---|
| 2,194,551 A * | 3/1940 | Holman | 140/109 |
| 3,465,408 A | 9/1969 | Clark et al. | |
| 3,479,716 A | 11/1969 | Zanger, Jr. et al. | |
| 3,584,861 A * | 6/1971 | MacDonald, Jr. | 269/154 |
| 4,520,557 A | 6/1985 | Harigane et al. | |
| 4,721,488 A * | 1/1988 | Dougherty et al. | 445/30 |
| 4,891,879 A | 1/1990 | De Lange | |
| 5,084,962 A * | 2/1992 | Takahashi et al. | 29/833 |
| 5,323,528 A | 6/1994 | Baker | |
| 5,625,941 A | 5/1997 | Ozawa | |
| 5,667,128 A | 9/1997 | Rohde et al. | |
| 5,891,295 A | 4/1999 | Barringer et al. | |
| 5,933,942 A | 8/1999 | Kitamura et al. | |
| 6,540,950 B1 | 4/2003 | Coffield | |
| 6,601,632 B2 | 8/2003 | Bouveresse et al. | |
| 6,873,347 B2 | 3/2005 | Sasaki | |
| 6,899,398 B2 | 5/2005 | Coffield | |
| 6,966,606 B2 | 11/2005 | Coffield | |
| 7,278,459 B2 * | 10/2007 | Baan et al. | 156/494 |
| 7,810,545 B2 * | 10/2010 | Bernardi | 160/328 |
| 2005/0085034 A1 | 4/2005 | Akiba et al. | |
| 2006/0090332 A1 | 5/2006 | Taban | |
| 2006/0096635 A1 | 5/2006 | Tuttle | |
| 2006/0181095 A1 | 8/2006 | Bonora et al. | |

FOREIGN PATENT DOCUMENTS

| CN | 2843841 | 12/2006 |
|---|---|---|
| CN | 2843841 Y | 12/2006 |

OTHER PUBLICATIONS

Application No. PCT/US2008/084467, International Search Report and the Written Opinion of the International Searching Authority, or the Declaration dated Feb. 4, 2009. 9 pages.

* cited by examiner

*Primary Examiner* — David Bryant
*Assistant Examiner* — Christopher Koehler
(74) *Attorney, Agent, or Firm* — Schmeiser, Olsen & Watts LLP

(57) ABSTRACT

Apparatus and method to aid in the reproducible and reversible tensioning of flexible substrates, such as polyimide or other file, to ensure planarity before, during, and after processing while mounted in tensioning apparatus.

6 Claims, 5 Drawing Sheets

FLEXIBLE SUBSTRATE TENSIONER

BACKGROUND OF THE INVENTION

1. Technical Field

This invention relates generally to physical management of flexible substrates. More particularly, the present invention relates to an apparatus and method for easy yet precisely controlled fixturing, tensioning, and ancillary processing of flexible substrates for fabrication and assembly of surface mount products or processing steps there between.

2. Related Art

Flexible substrates are utilized in many different applications and it is often necessary to physically manage how flexible substrates are handled. A common handling method involves mounting a flexible substrate to a split frame and then tensioning the substrate by virtue of stretching the split frame. In order to reduce possible distortion of the flexible substrate when it is tensioned by a split frame, it often necessary for the frame to include means to flatten the flexible substrate prior to mounting the substrate onto the frame. However, flattening a substrate prior to mounting is not always feasible because flattening involves additional handling steps adding to handling complexity. Moreover, flattening prior to mounting is often time unsuitable for delicate substrates which may break or distort due to forces applied during flattening or deform because of forces generated by distorted flattening means of the frame. Frames without flattening means do not correct substrate distortions by flattening the flexible substrate prior to mounting. Another common substrate handling method involves mounting the material to a frame that exhibits an equal or higher coefficient of thermal expansion ("CTE") to that of the substrate material. Thus, when heated, the frame material expands faster than the substrate and the flexible substrate becomes tensioned. Yet, this thermally relative substrate handling method often requires exotic frame materials, which can be expensive. In addition a mismatch of the CTE of the substrate material to the CTE of the frame material may also lead to breakage or distortion of the flexible substrate. Still another known flexible substrate handling method is to laminate the substrate material onto a rigid frame for processing. This more permanent handling method, however, may limit the post-processing options because of the laminate.

Therefore, there exists a need for an apparatus and method for reliably tensioning a flexible substrate to remove undesirable defects, such as wrinkles or other non-planar conditions that may be introduced as a result of fabrication, mounting, or other operations. The presently disclosed improvement allows for accurate, controlled, and reproducible registration of the flexible substrate for patterning, printing, placement, reflow, deposition, or any other standard assembly technique requiring precise registration and/or use of a vision system.

SUMMARY OF THE INVENTION

The present invention provides an apparatus and method to aid in the reproducible and reversible tensioning of flexible substrates and ensure substrate planarity before, during, and after processing while mounted in the tensioning apparatus.

A first aspect of the present invention provides an apparatus for tensioning a flexible substrate mounted on a frame comprising: a pallet configured to hold the frame; and a clamp configured to engage the pallet so that the frame and flexible substrate are positioned between the pallet and the clamp; wherein when the clamp is engaged with the pallet and advanced toward the pallet the flexible substrate is tensioned.

A second aspect of the present invention provides a method of tensioning a flexible substrate mounted on a frame, the method comprising: providing a clamp including: a plurality of knife edges; and a plurality of feet extending from the clamp; providing a pallet including: a top member; and a guide ring; and manipulating the clamp with the pallet so that the flexible substrate is stretched by the pallet as the clamp is drawn downward by the guide ring as it rotates relative to the top member of the pallet.

BRIEF DESCRIPTION OF THE DRAWINGS

Some embodiments of this invention will be described in detail, with reference to the following figures, wherein like designations denote like members, wherein.

DETAILED DESCRIPTION OF THE INVENTION

Figure 1A:
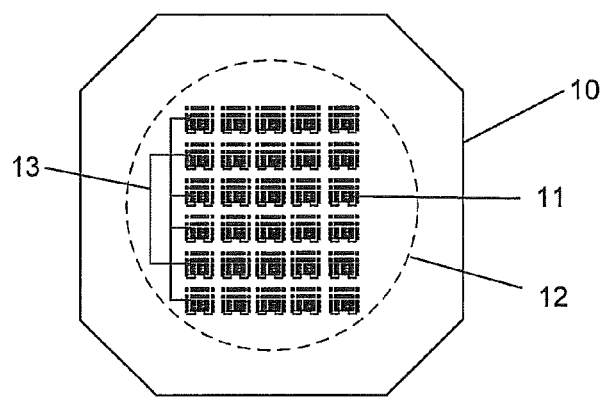
FIG. 1A depicts a top view of an embodiment of a flexible substrate.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. and are disclosed simply as an example of an embodiment. The features and advantages of the present invention are illustrated in detail in the accompanying drawings, wherein like reference numerals refer to like elements throughout the drawings.

As a preface to the detailed description, it should be noted that, as used in this specification and the appended claims, the singular forms "a", "an" and "the" include plural referents, unless the context clearly dictates otherwise.

In general an embodiment of a flexible substrate tensioner may comprise two primary components: a clamp and a pallet. A flexible substrate serves as a base material on which a process is conducted or onto which other materials may be added. For example the flexible substrate may be a catalytic material upon which various chemical species may react and/or may be a base material that images will be printed onto. Often a flexible substrate may comprise a material upon which conductive or semiconductive devices are fabricated and/or electrical components are placed onto. Accordingly the flexible substrate may be known as a base film, a flexible wafer, or a flexible printed circuit board (flexible PCB). The flexible substrate is typically mounted to a frame or other structural support member. The pallet of an embodiment of a flexible substrate tensioner may include a mandrel over which a flexible substrate or film may be drawn. The pallet may also contain recesses or guide features to help seat the flexible substrate and the frame over the mandrel, and also to guide positioning of the clamp of the flexible substrate tensioner with the mandrel when the tensioner is in either a relaxed state or a taut and tensioned state. The clamp may include a plurality of blades or sharp edges affixed to or formed integrally with an annular structure that fits about the perimeter and overlaps the flexible substrate and mounted frame to some extent. The clamp may also include feet that may extend from the back side of the clamp through the pallet when the clamp is operably positioned with the pallet. Tension may be applied to the clamp by the guide ring operating with the feet of the clamp and drawing the clamp into the recesses or guide features of the pallet. The guide ring may have grooves and/or slots positioned annularly and into which the feet of the clamp may be inserted; the grooves and/or slots may be inclined and as the guide ring is rotated, the feet of the clamp may be drawn down from the pallet and apply a clamping force on the substrate mounting frame, stretching the flexible substrate tight against the mandrel. The guide ring is typically attached to the backside of the pallet by means of a screw or other fastener. A torsion spring, coil, or other compliant member may be captured between the guide ring and pallet in order to apply force to tension the guide ring and facilitate the loading and/or unloading of the clamp to and from operable position with the pallet as well as maintain applied pressure through thermal excursions, including reflow, via a pawl or other physically interactive component which helps to hold the ring in a constant position. In addition, the guide ring may have reeded edges which may be used for indexing the guide ring in order to tension the flexible substrate in a reproducible manner. The feet may be tapered and long enough to permit simplified mounting and dismounting processes by rotating the ring to the loading/unloading position, then seating the clamp/pallet assembly against a flat reference plane and applying a downward force on the pallet to unseat the clamp from the pallet.

Figure 1B:
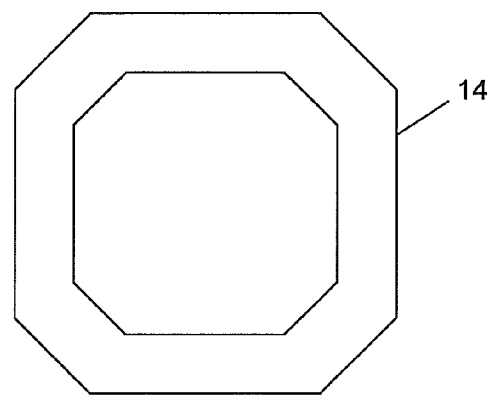
FIG. 1B depicts a top view of an embodiment of a metal frame, in accordance with embodiments of the present invention.
Figure 1C:
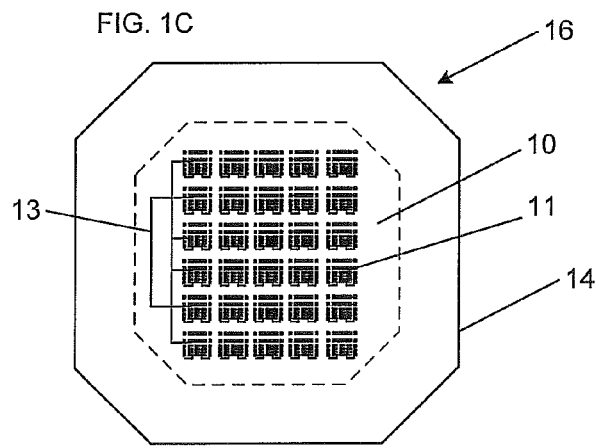
FIG. 1C depicts a top view of an embodiment of a flexible substrate mounted on an embodiment of a metal frame, in accordance with embodiments of the present invention.
Figure 1D:
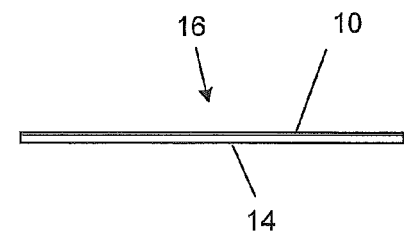
FIG. 1D depicts a side view of an embodiment of a frame-mounted flexible substrate, in accordance with embodiments of the present invention.

Turning now to the drawings, FIGS. 1A-1D depict top and side views of an embodiment a flexible substrate 10, a frame 14 and the flexible substrate assembled with and mounted on the frame 14. As shown in FIG. 1A, embodiments of a flexible substrate 10 may be formed from polyimide or other film substances and may have electronic components 11 mounted thereon or have electrical traces 13 formed thereon. The electronic components 11 or electrical traces 13 may be located within a more centralized portion of the flexible substrate 10, as indicated by the dashed-line circular region 12. However, those in the art should recognize that traces 13 or components 11 may be assembled onto any operable portion of the flexible substrate 10. During an assembly process the flexible substrate may need to have components picked from or placed onto the substrate 10, or may have other materials dispensed upon it, such as glue or solder paste. It is often important that the flexible substrate 10 be located in a non-flexed, somewhat rigid condition for assembly processes to be successful. Accordingly, as depicted in FIG. 1B, a frame 14 may be provided to give some amount of structural stiffening to the flexible substrate 10. The frame 14 may be formed from a metal such as stainless steel, Kovar, or other rigid and non-corroding metal, or other material with suitable properties for use in plating or deposition operations. The flexible substrate 10 may be mounted to the frame 14 in various ways, such as through the use of adhesives, welds, fasteners, or other means. More often than not the flexible substrate 10 is mounted on frame 14 as shown in FIG. 1C with an adhesive. This adhesive is typically a cross-linked thermosetting epoxy suitable for use in thin bond lines and lamination operations. When the flexible substrate 10 is mounted on the frame 14, the two components form a unitary frame-mounted flexible substrate 16 component. The dashed line depicted in FIG. 1C is provided to reveal the location of the frame 14 which is not visible in a top view of a frame-mounted flexible substrate 16 component. FIG. 1D shows the relative positioning of the various elements of a frame-mounted flexible substrate 16 when viewed from the side.

Figure 2A:
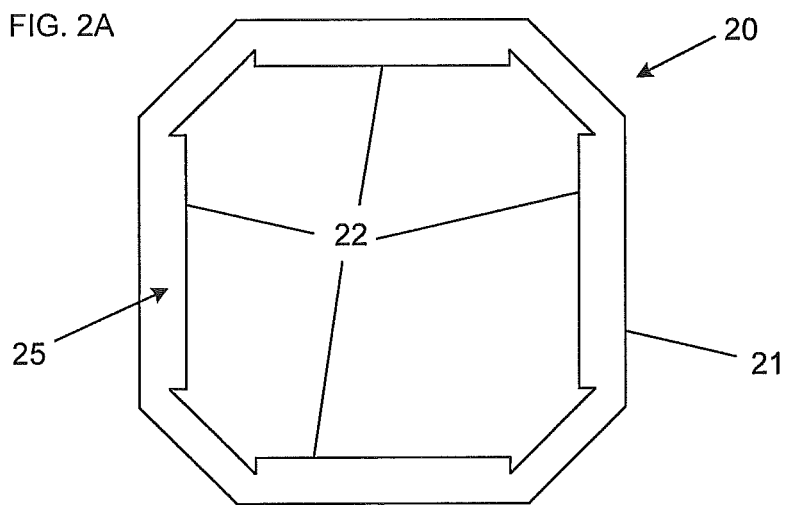
FIG. 2A depicts a top view of an embodiment of a clamp, in accordance with embodiments of the present invention.
Figure 2B:
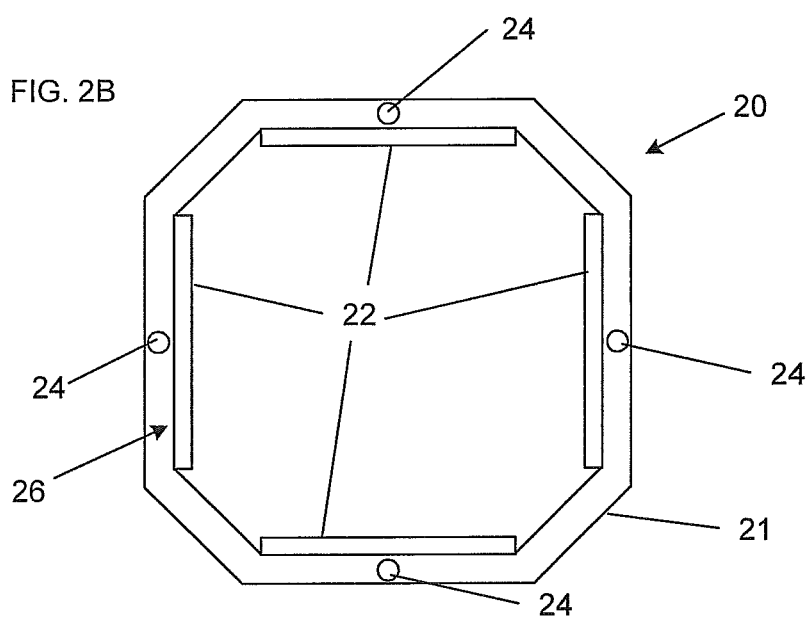
FIG. 2B depicts a bottom view of an embodiment of a clamp, in accordance with embodiments of the present invention.
Figure 2C:
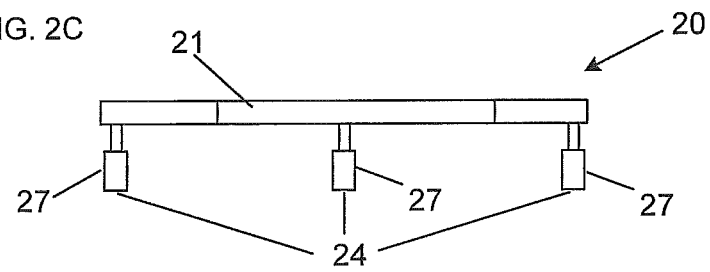
FIG. 2C depicts a side view of an embodiment of a clamp, in accordance with embodiments of the present invention.

With continued reference to the drawings, FIGS. 2A-2C depict top, bottom, and side views respectively of an embodiment of a clamp 20. Clamp 20 may include knife edges 22. The knife edges 22 may be thin structures, such as lips or flanges that extend or protrude inward from the outer casing structure 21 of the clamp 20. The knife edges 22 may be flush with the top surface 25 of the casing structure 21 of clamp 20. Additionally the clamp 20 may include feet 24. The feet 24 may extend perpendicularly downward from the bottom surface 26 of the casing structure. Moreover, the feet 24 may have shoe elements 27 and may be tapered at the distal ends for ease of insertion or removal. The casing structure 21, knife edges 22, and feet 24 may be integrally formed together, or may be distinct components individually attached together to form the clamp 20. The clamp 20 and/or individual component elements of the clamp 20 may be made from stainless steel which is rigid and non-corroding, or may be may be made from any other suitable, thermally stable, material. The knife edges 22 and feet 24 may be configured to aid in stretching the flexible substrate 10 when the clamp 20 and mounted flexible substrate 16 (see FIGS. 1A-1D) are assembled into a pallet 40 (see FIG. 3A). There are typically four knife edges 22 and four feet 24, however, these numbers may increase or decrease depending upon the type and size of flexible substrate 10 to be stretched or tensioned.

Figure 3A:
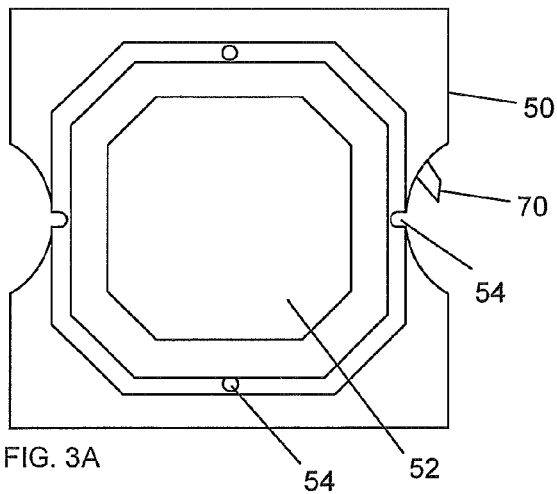
FIG. 3A depicts a top view of an embodiment of a top member of an embodiment of a pallet, in accordance with embodiments of the present invention.
Figure 3B:
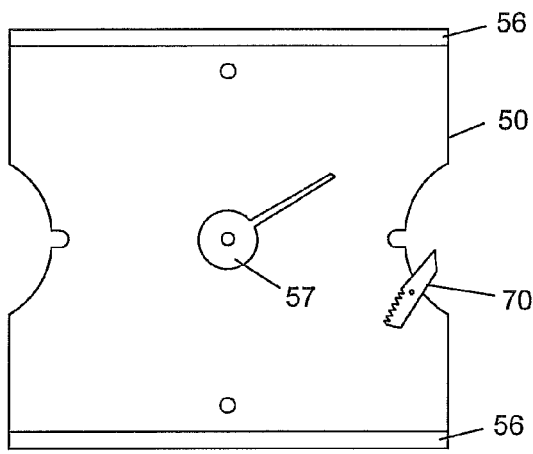
FIG. 3B depicts a bottom view of an embodiment of a top member of an embodiment of a pallet, in accordance with embodiments of the present invention.
Figure 3C:
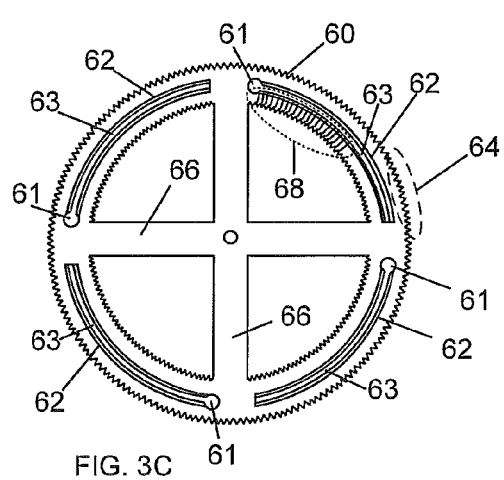
FIG. 3C depicts a top view of an embodiment of a guide ring, in accordance with embodiments of the present invention.
Figure 3D:
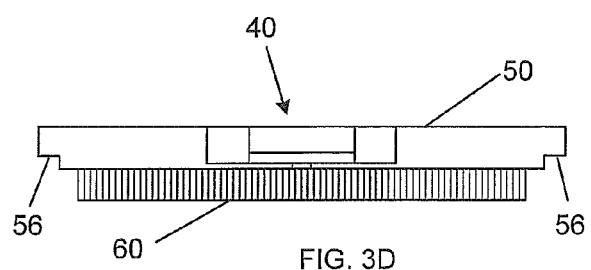
FIG. 3D depicts a side view of an embodiment of a pallet having a mounted guide ring, in accordance with embodiments of the present invention.

Referring further to the drawings, FIGS. 3A-3D, depict views of an embodiment of a pallet 40 and various component elements of the pallet 40. Pallet 40 includes a top member 50, a guide ring 60, and a pawl 70. FIG. 3A depicts a top view of a top member 50 of a pallet 40. The top member 50 may include a mandrel 52, holes 54 and edges 56. The pawl 70 may be operably connected to the underside of top member 50, as depicted in FIG. 3B. Teeth of the pawl 70 may be configured to engage teeth 64 of guide ring 60. As shown in FIG. 3C, the guide ring 60 may include one or a plurality of grooves 62, a plurality of teeth 64, cross bars 66, and an optional index 68. The groove(s) 62 may be located in substantial co-axial alignment with the body of ring 60 and may be inclined from shoe opening portions 61. The shoe opening portions 61 may be configured to allow shoes 27 of feet 24 of the clamp 20 to be inserted through the guide ring 60 and fitted into grooves 62. The grooves 62 may include through slots 63, which allow the feet 24 to move rotationally about a central axis of the guide ring 60 after the feet 24 are inserted through the shoe opening portions 61 and seated in grooves 62. The grooves 62 may interact with the feet 24 and guide advancement of the feet 24 in a direction away from the substrate 10. For instance, the inclination or tapering of the grooves 62 may be configured so that the feet 24 may be slid along the inclined grooves 62 as the ring 60 is rotated. Hence, when the ring 60 is rotated, clamp 20 may be generally advanced toward the pallet 40 as the feet 24 track along the incline of the grooves 62. When the feet 20 travel down the incline of the grooves 62, the clamp 20 may be drawn down from the pallet 40 and apply a clamping force on the substrate mounting frame 14, stretching the substrate 10 tight against the mandrel 52. Where an embodiment of a guide ring 60 includes grooves 62 placed equidistant around the ring 60, the tensioning of the substrate 10 occurs evenly.

Top member 50 and guide ring 60 are typically formed from Rochling Durostone CAS761 fiber reinforced plastic, but may be formed of various other suitable materials which are rigid, thermally stable (during mass reflow), and inert to chemicals which may contact top member 50 and guide ring 60 during processing. The mandrel 52 of the top member 50 may be a raised portion of pallet 40 dimensioned to fit within the central portion of frame 14 (see FIGS. 1A-1D). Thus, the mandrel 52 can act upon the flexible substrate 10 when the mounted flexible substrate 16 is being drawn downward via clamp 20 as operably positioned with the pallet 40. In this manner, the flexible substrate 12 may be stretched or tensioned upwards away from frame 14. The holes 54 of top member 50 may be configured to allow feet 24 of clamp 20 to pass through to shoe opening portions 61 of grooves 62 formed on guide ring 60 thereby capturing the feet 24 of clamp 20 in order to facilitate the provision of a downward motive force upon frame 14 and move frame 14 relative to flexible substrate 12 in operable engagement with mandrel 52. This downward motion may occur through the rotation of guide ring 60 by either a cam or spring action, or by other operable means. In the case of a cam action, grooves 62 of guide ring 60 may be tapered or inclined such that the grooves 62 are thinner at the point where feet 24 of clamp 20 pass through ring 60 and then gradually thicken or incline thereby drawing feet 24 downward as the ring 60 is rotated. In the case of downward motion facilitated by spring action, a spring (not shown), such as a torsion spring, may be mounted between top member 50 and guide ring 60. The spring may operably engage or rest within an optional depression 57 formed on the underside of top member 50. The spring may act to help push guide ring 60 away from top member 50 thereby causing the feet 24 captured in grooves 62 to be drawn downward. The pawl 70 may be used to hold guide ring 60 in position once the flexible substrate 12 is properly tensioned. The pawl 70 may be a spring-loaded braking mechanism provided to facilitate positional locking of the guide ring 60. The braking mechanism of the pawl 70 may bear complimentary teeth to engage the teeth on the perimeter of the guide ring 60, and may be spring-loaded to allow for easy release. For example, the release may be located such that the person's one hand may be used to disengage the brake mechanism, while the person's other hand may be used to hold the base 50 steady and reposition the guide ring 60. When the person completes positioning operations, the brake mechanism may be released and the load from the spring, acting through the brake mechanism, may hold the guide ring 60 securely in the desired position. Fasteners (such as a screw, a bolt, a rivet, or the like, not shown) which may function as the axis of rotation on the guide ring 60 and as a pivot for the pawl 70 may be recessed. This will allow a smooth surface on the back side of pallet 40. In conjunction with feet 24 on clamp 20 and the brake, this acts to promote simplified loading and unloading of pallet 40 by allowing the clamp 20 to travel upward and out of the fixture seat when the guide ring 60 is locked in the unloading position by the brake.

A shim (not shown) may also be used to allow for damage-free ultra fine pitch printing with very thin stencils or screens by adjusting for a gap that may be created by operable positioning of recessed clamp 20.

Figure 4A:
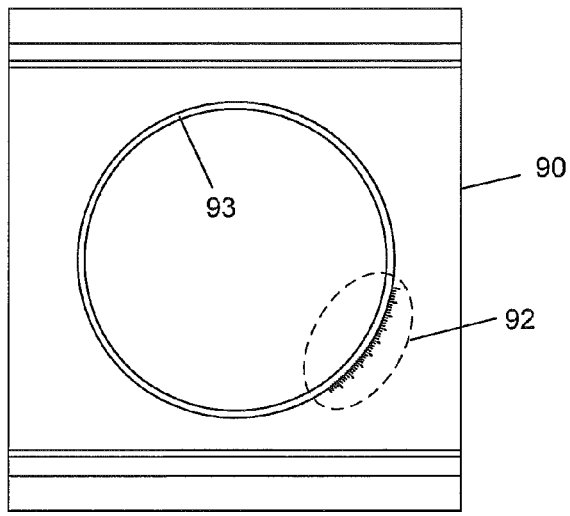
FIG. 4A depicts a top view of an embodiment of a base of an embodiment of a carrier, in accordance with embodiments of the present invention.
Figure 4C:
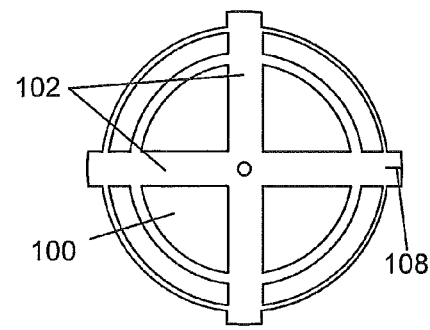
FIG. 4C depicts a top view of an embodiment of an interposer of an embodiment of a carrier, in accordance with embodiments of the present invention.
Figure 4B:
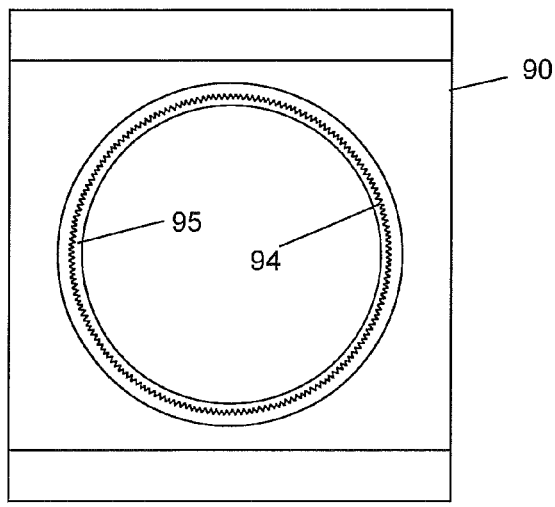
FIG. 4B depicts a bottom view of an embodiment of a base of an embodiment of a carrier, in accordance with embodiments of the present invention.
Figure 4D:
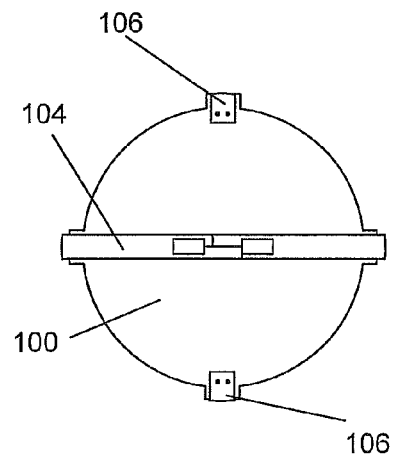
FIG. 4D depicts a bottom view of an embodiment of an interposer of an embodiment of a carrier, in accordance with embodiments of the present invention.
Figure 4E:
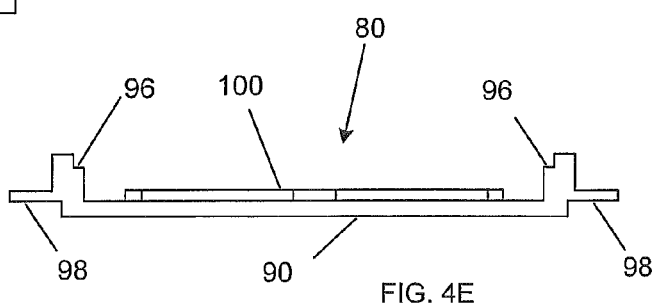
FIG. 4E depicts a side view of an embodiment of a carrier, in accordance with embodiments of the present invention.

To aid in the handling and processing of the flexible substrate 12, a carrier 80 may used. The carrier 80 and its various subcomponents are depicted in FIGS. 4A-4E. The carrier 80 may include a base 90 (shown in FIGS. 4A-4B, and 4E) and an interposer 100 (shown in FIGS. 4C-4D, and 4E). Base 90 may be formed from aluminum or steel characterized by its ability to hold shape, be thermally stable at processing temperatures, and transfer heat away from or toward the flexible substrate 12. Other suitable materials may also be used to form the base 90. Base 90 may include an optional index gauge 92 (indicated within the dashed-line oval shown in FIG. 4A), teeth 94, upper ledges 93, 96 and lower ledges 95, 98. The top side of interposer 100 may include grooves 102 configured to mate with the cross bars 66 of guide ring 60. The interposer may be formed of aluminum or steel, but other suitable materials may be used to form the component which hold shape and are thermally stable. The bottom side of interposer 100 may include rotation lock means 104, wings 106, and optional index mark 108 and is typically made from aluminum or steel due their ability to hold a given shape and remain thermally stable. A gap exists between the bottom of grooves 102 and the tops of rotation lock means 104 and wings 106 to accommodate the thickness between upper ledge 93 and lower ledge 95 of base 90. When the carrier 80 is in an assembled condition, the interposer 100 sits on upper ledge 93 of base 90 via the bottom side of the ends of grooves 102, and is held on to base 90 via the tops of wings 106 and rotation lock means 104 interfacing with lower ledge 95 of base 90. When the rotation lock means 104 are disengaged, interposer 100 is allowed to rotate relative to base 90 such that when pallet 40 is placed onto carrier 80, the grooves of interposer 100 align to the cross bars 66 of ring 60. The rotation lock means, as depicted in FIG. 4D, may comprise two opposing bars that are forced apart by a spring. When the bars are squeezed together; interposer 100 is allowed to rotate freely. When the bars are forced apart the teeth at the end of the bars engage with the teeth 94 of base 90 thereby locking interposer 100 into position. Upper ledges 96 on base 90 may be used to support pallet 40. Lower ledges 98 on base 90 may be used to aid in the transportation of carrier 80 via a conveyor system or other movement means in which the lower ledges 98 may ride on or otherwise engage with. The optional index mark 108 of interposer 100 may be used in combination with index gauge 92 of base 90 along with optional index 68 of guide ring 60 for simplifying alignment or registration of support pallet 40 to carrier 80 and is described in greater detail below.

Figure 5A:
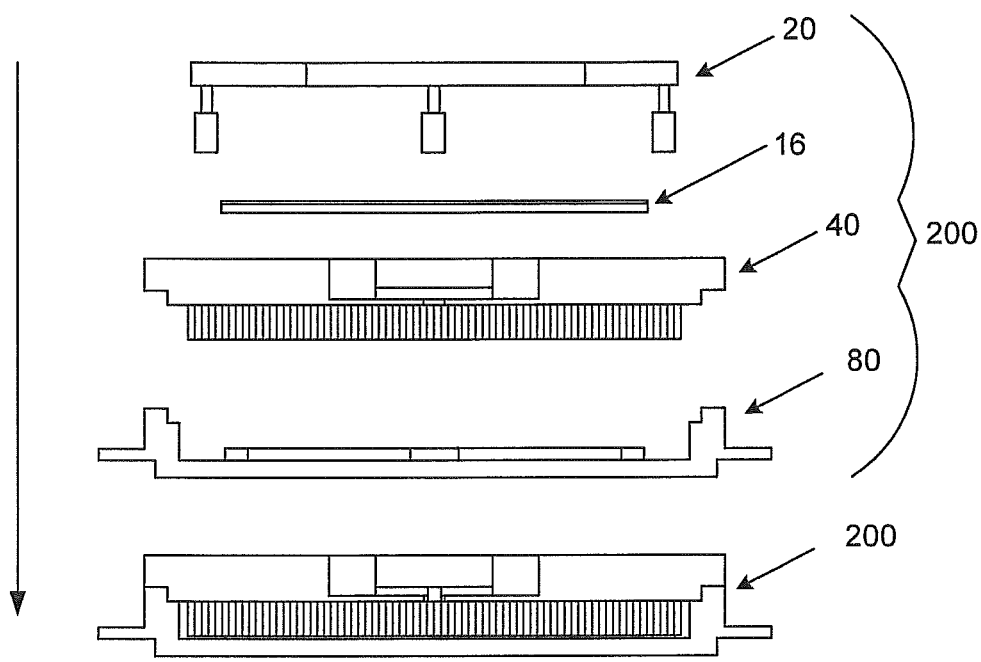
FIG. 5A depicts a side view of various elements to be assembled onto a carrier to form an embodiment of a flexible substrate tensioner, in accordance with embodiments of the present invention.
Figure 5B:
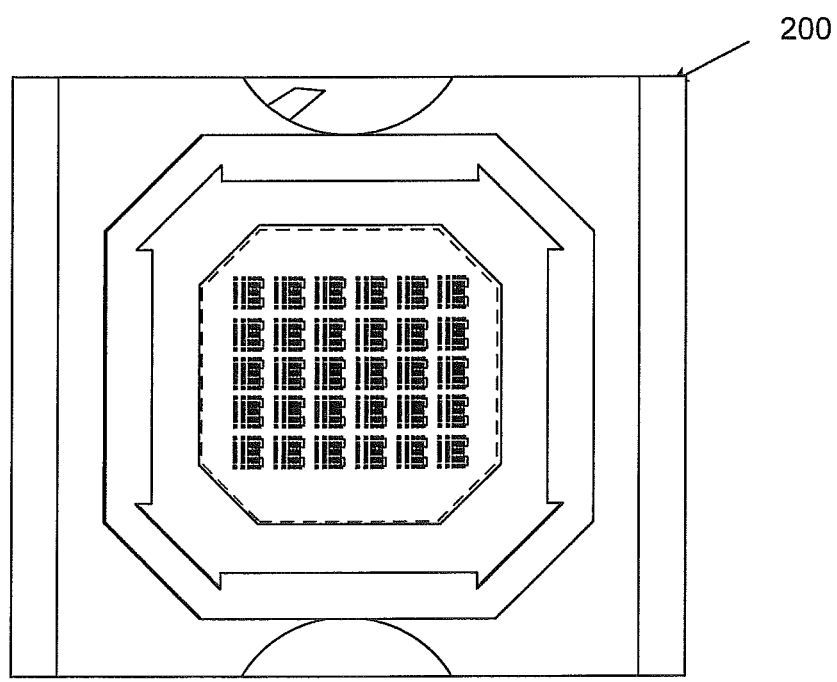
FIG. 5B depicts a top view of various elements assembled onto a carrier and forming an embodiment of a flexible substrate tensioner, in accordance with embodiments of the present invention.

Referring still further to the drawings, FIGS. 5A-5B depict views of an embodiment of the order of assembly of the various components of a flexible substrate tensioner 200 and the fully tensioned flexible substrate operation of the flexible substrate tensioner 200. During handling, frame-mounted flexible substrate 16 may be positioned on the protruding mandrel 52 formed in top member 50 of pallet 40, so that the mandrel fits within the internal portion of the frame 14 and against the bottom of flexible substrate 10. Clamp 20 then is placed on top of the frame-mounted flexible substrate 16 such that feet 24 are oriented pass through holes 54 of top member 50 and through the shoe openings 61 in grooves 62 of ring 60. Knife edges 22 are positioned to contact the frame 14 of frame-mounted flexible substrate 16. As guide ring 60 is rotated relative to top member 50 of pallet 40, feet 24 are gripped by, or otherwise engage with grooves 62 and are drawn downward, through facilitation of a spring or cam action as operable with a possible incline of the grooves 62, such that the knife edges 22 push down on frame 14 stretching or tensioning flexible substrate 12 over mandrel 52 as the feet 24 advancingly interact with the guide ring 60 of pallet 40. The plurality of grooves 62 of the guide ring 60 interact with the plurality of feet 24 of the clamp 20 and guide advancement of the plurality of feet 24 in a simultaneous manner so as to provide even tensioning of the flexible substrate 12. Moreover, the plurality of teeth 64 interact with the pawl 70 to stop movement of the clamp 20 toward the pallet 40 and secure the frame mounted flexible substrate 16 in a tensioned condition. Thus, once the frame-mounted flexible substrate 16 is in a tensioned position, the pawl 70 then holds the guide ring 60 in a secure position. The Interposer 100 may then be rotated to align grooves 102 with crossbars 66 of guide ring 60 and the pallet 40 may be assembled onto the carrier 80.

To aid in the alignment of grooves 102 with crossbars 66, the base 90 may be provided with an index gauge 92 and guide ring 60 may have reeded edges incorporated into such that index gauge 92 correlates to the reeded edges. Thus, embodiments having an index gauge may permit a person assembling pallet 40 onto carrier 80 to determine the rotational distance guide ring 60 has been rotated with respect to top member 50 of pallet 40 by counting the reeded edges. The person may then rotate interposer 100 of carrier 80 to line up with the correct index line of index gauge 92 on base 90 based on the amount of reeded edges counted. Accordingly, the pallet 40 may then placed onto carrier 80 with the grooves 102 pre-aligned to crossbars 66. For instance, the teeth 94 may be spaced at a 1° increment about the interior of the opening in base 90 and may be cut at a 45° angle to provide maximum engagement with the rotation lock means 104 of interposer 100 when interposer 100 is rotated in either direction. The rotation lock means 104 may be a spring-loaded braking mechanism provided to facilitate positional locking of the interposer 100. The braking mechanism of the rotation lock means 104 may bear complimentary teeth to engage the teeth 94 on the interior of the base 90, and may be spring-loaded to allow for easy release. For example, the release may be located such that the person's one hand may be used to disengage the brake mechanism, while the person's other hand may be used to hold the base 90 steady and reposition the interposer 100. When the person completes positioning operations, the brake mechanism may be released and the load from the spring, acting through the brake mechanism, may hold the interposer 100 securely in the desired position.

In addition, to yet further improve the ease alignment of grooves 102 with crossbars 66, an index 68 may be included on the guide ring 60. For example, a person assembling pallet 40 on to the carrier 80 may determine the rotational distance that guide ring 60 has been rotated with respect to top member 50 of pallet 40 by reading the index 68. The person may then rotate interposer 100 of carrier 80 to line up optional index 108 on interposer 100 with the correct index line of index gauge 92 on base 90 based on the amount of rotation indicated by index 68. The pallet 40 may then placed onto carrier 80 with the grooves 102 pre-aligned to crossbars 66.

Various flexible substrate handling advantages are achieved through use of embodiments of flexible substrate tensioners 200. For instance, a flexible substrate tensioner 200 permits easy yet precisely controlled post-mounting tensioning of flexible substrates 10 mounted on rigid frames 14. The substrate tensioning process through simple rotation of the guide ring 60 is relatively simple; lamination, exotic alloy frames, disposable components, and complex operations are no longer required for tensioning. Additionally, the embodiments of the flexible substrate tensioner 200 may be completely mechanical so that no pneumatic actuation is required. The technology embodied in a flexible substrate tensioning apparatus 200 has been found to aid in the reproducible and reversible tensioning of flexible substrates 10, such as a polyimide or other film, to ensure planarity before, during, and after processing. Moreover, undesirable defects, such as wrinkles or other non-planar conditions introduced as a result of fabrication, mounting, or other handling operations and not resulting from excessive material addition or subtraction during standard fabrication and assembly processes, may be removed via use of embodiments of a flexible substrate tensioner 200 to allow for accurate registration of the flexible substrate 10 for patterning, printing, placement, reflow, deposition, or any other standard assembly technique requiring precise registration and/or use of a vision system.

One other structural and functional feature may be that the finishes of the pallet 40 and/or the carrier 80 are non-reflective except for one or more corners of the carrier 80. This embodied non-reflective design may be provided so that as the carrier 80 is transported through a handling system, the system may detect the presence and/or passage of the carrier 80 by using means such as a reflective sensor or infrared sensor. The reflective sensor may comprise a light emitter and a light sensor. When the reflective sensor emits light from the light emitter and the carrier 80 passes by the reflective sensor, the emitted light may reflect off of the reflective corner of the carrier 80 back to the light sensor of the reflective sensor thereby detecting the presence and/or passage of the carrier 80.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention.

What is claimed is:

1. A method of tensioning at least one of a base film, a flexible wafer, and a printed circuit board mounted on a frame, the method comprising:
   providing a clamp including:
      a plurality of knife edges; and
      a plurality of feet extending from the clamp;

providing a pallet holding the frame, the pallet including:
a top member; and
a guide ring; and manipulating the clamp with the pallet so that the at least one of the base film, the flexible wafer, and the flexible printed circuit board is stretched by the pallet as the clamp is drawn downward by the guide ring as it rotates relative to the top member of the pallet.

2. The method of claim 1, further comprising pushing down with the knife edges on the at least one of the base film, the flexible wafer, and the flexible printed circuit board to tension it as the feet advancingly interact with the pallet.

3. The method of claim 2, wherein the provided pallet further includes a pawl, the method further comprising rotating the guide ring relative to the top member and holding the guide ring in position by the pawl.

4. The method of claim 3, wherein the top member further comprises a mandrel, and a plurality of holes, the method further comprising pushing the mandrel upon the flexible substrate in a direction opposite the knife edges as the plurality of feet advancingly interact with the pallet through the plurality of holes.

5. The method of claim 4, wherein the guide ring further comprises a plurality of grooves and a plurality of teeth, the method further comprising the plurality of grooves interacting with the plurality of feet and guiding advancement of the plurality of feet, the method further comprising the plurality of teeth interacting with the pawl to stop movement of the clamp toward the pallet and secure the flexible substrate in a tensioned condition.

6. The method of claim 2, wherein the tensioning of the substrate occurs evenly.

* * * * *